United States Patent [19]

Lai et al.

[11] Patent Number: 5,012,494
[45] Date of Patent: Apr. 30, 1991

[54] METHOD AND APPARATUS FOR CLOCK RECOVERY AND DATA RETIMING FOR RANDOM NRZ DATA

[75] Inventors: Benny W. H. Lai, San Jose; Richard C. Walker, Palo Alto, both of Calif.

[73] Assignee: Hewlett-Packard Company, Palo Alto, Calif.

[21] Appl. No.: 432,869

[22] Filed: Nov. 7, 1989

[51] Int. Cl.$^5$ .............................................. H04L 7/033
[52] U.S. Cl. ...................................... 375/120; 331/17
[58] Field of Search ..................... 375/120, 87, 110; 331/1 R, 17, 36 R, 36 C, 184, 57; 307/510, 511; 360/41, 51

[56] References Cited

U.S. PATENT DOCUMENTS

| | | | |
|---|---|---|---|
| 4,244,043 | 1/1981 | Fujita et al. | 331/17 |
| 4,375,693 | 3/1983 | Kuhn | 375/120 |
| 4,789,996 | 12/1988 | Butcher | 375/120 |

Primary Examiner—Douglas W. Olms
Assistant Examiner—Marianne Huseman

[57] ABSTRACT

A method and apparatus for recovering a clock signal from a random NRZ data signal is shown to include a phase detector for detecting the phase difference between the random NRZ data signal and a clock signal and for generating a phase signal representative of the phase difference. The phase signal is a binary signal having first and second logic levels, wherein the first logic level is representative of the clock signal having an early phase relationship with the data signal and wherein the second logic level is representative of the clock signal having a late phase relationship with the data signal. Clock recovery also incorporates an integrator for integrating the phase signal over a period of time and for generating an integration signal representative of such integration and an oscillator for generating the clock signal at a clock frequency responsive to both the phase signal and the integration signal. The clock frequency is determined by a centering factor and an offset factor. The centering factor is controlled by the phase signal. There is also shown a particular phase detector, several integrators and a preferred oscillator for practicing the invention.

24 Claims, 7 Drawing Sheets

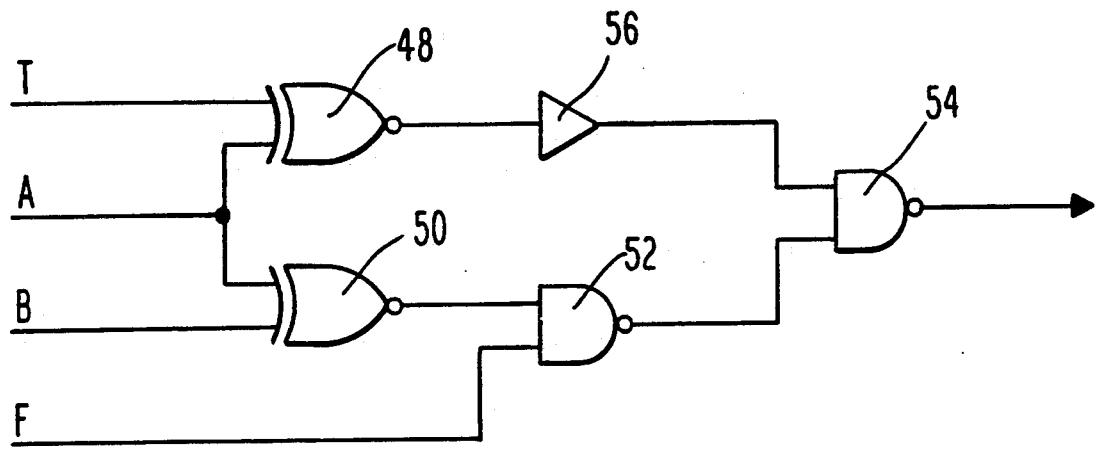
_Fig. 6_
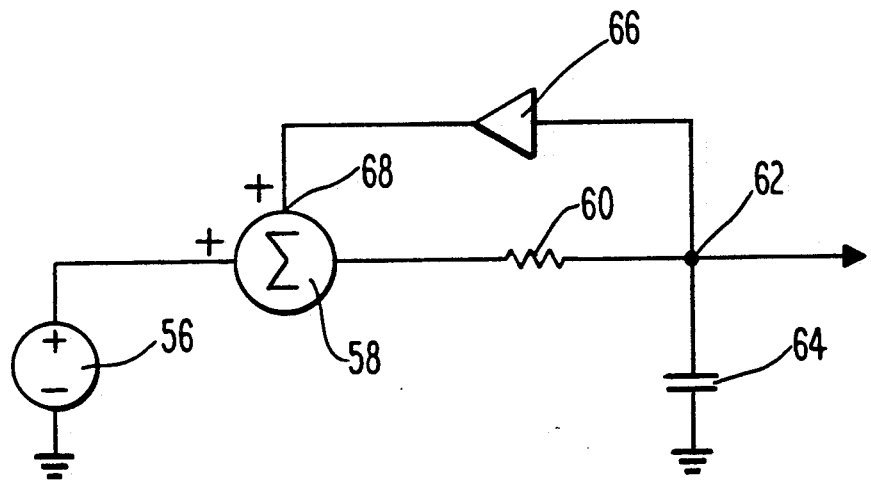
_Fig. 7_
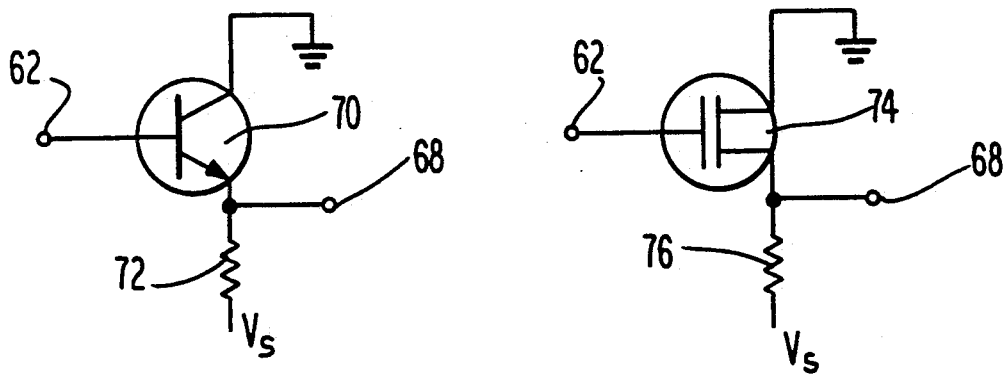
_Fig. 8_                _Fig. 9_

METHOD AND APPARATUS FOR CLOCK RECOVERY AND DATA RETIMING FOR RANDOM NRZ DATA

FIELD OF THE INVENTION

The present invention relates generally to the field of data transmission and communication systems and more particularly to recovering a clock signal from transmitted NRZ (non-return-to-zero) data and to retiming or regenerating the transmitted NRZ data utilizing the recovered clock signal.

BACKGROUND OF THE INVENTION

In a random NRZ data signal, data are represented by a constant signal level for the full duration of a bit interval, i.e. one clock cycle. For example, an NRZ data signal is shown in FIG. 1. In NRZ type signals, a high signal level during a bit interval indicates a logic one, while a low signal level during a bit interval indicates a logic zero. NRZ data signals are preferred, due to their simplicity in generation. By contrast, RZ (return-to-zero) data signals return to zero during each bit interval, thereby requiring a greater frequency to transmit identical information contained in an NRZ data signal.

If a clock signal such as that shown in FIG. 1 is used to trigger the horizontal sweep of an oscilloscope and an NRZ data signal is applied to the vertical channel of such an oscilloscope, a distinctive pattern known as an eye diagram will appear. Such an eye diagram is shown for the input data signal in FIG. 1. When data is received and depicted on an oscilloscope in this fashion, multiple transitions of the data are superimposed, thereby defining each bit or clock period. In order to insure maximum reliability when sampling NRZ data signals, it is desirable to sample such signals at the midpoint of each bit interval. As shown in FIG. 1, utilization of the rising edge of the clock signal to sample the input data assures that sampling will occur at the midpoint of each eye pattern or bit interval. By sampling at such times, the input data can be regenerated.

Such regeneration is known to be desirable in transmission and communication systems in order to remove noise and other degradation of the data signal. If the clock signal assures sampling of the input data at the midpoint of each bit interval, an output data signal can be generated which when viewed on an oscilloscope will appear similar to the output eye diagram shown in FIG. 1. Since a clock signal is typically not transmitted with NRZ data signals, it will be necessary to recover the clock signal from the input data.

In the past, a number of techniques have been proposed for recovering the clock signal from a received data signal. These techniques can generally be divided into two classifications, namely, direct extraction techniques and phase locked loop techniques. In direct extraction techniques, typically the data signal is applied to a series arrangement including a non-linear detector, a high Q band pass filter and a limiter. The output of the limiter is used as the recovered clock signal.

One problem with direct extraction techniques, is their expense. Another problem associated with direct extraction techniques relates to performing clock extraction in circuitry which is independent from that circuitry used to retime data. Direct extraction techniques are generally not integrable. In such situations, it is not possible to control phase differences without the incorporation of additional compensating circuitry. Consequently, the phase differences which result from differences between the extraction and retiming circuitry are temperature dependent and will vary depending on the exact circuitry used. More common is the use of clock synthesis techniques.

In phase locked loop techniques, generally a local oscillator generates a clock signal which is compared to the incoming data stream in order to determine whether such clock signal is early or late in phase in relation to the data stream. Depending on whether the clock signal is early or late, the frequency of the local oscillator is adjusted higher or lower until the clock signal is determined to be in phase with the data signal.

U.S. Pat. No. 4,280,099—Rattlingourd discloses a digital timing recovery system for recovering a clock signal from NRZ data. In that system, an oscillator generates a local clock signal which is provided to a variable divider. The variable divider divides the oscillator signal by some integer amount and provides a clock output signal. The clock output signal is provided to a phase detector and compared with received NRZ data. The output of the phase detector is accumulated in a counter which in turn controls the integer used to divide the clock signal in the variable divider. As the integer is increased and decreased, the frequency of the clock signal generated by the variable divider will increase or decrease.

U.S. Pat. No. 4,371,974—Dugan discloses a digital phase detector for use with recovering clock pulses from received NRZ data. The phase detector is incorporated in a phase locked loop circuit. It is stated that the phase detector generates a phase error signal which is amplified and fed to a voltage controlled oscillator (VCO). The voltage controlled oscillator generates a clock signal having a frequency which is dependent upon the input voltage. The output of the voltage controlled oscillator is utilized by the phase detector for comparison with the received NRZ data.

The problem with such prior devices arises as data frequencies increase. As frequencies become higher, time delays inherent in digital devices become more significant in relation to the bit interval. As the bit interval becomes smaller, the time delay can assume a significant fractional portion of the bit interval, eventually preventing clock extraction and data retiming.

In addition, such prior phase locked loop techniques exhibit false lockup and jitter accumulation problems. False lock up can occur when the phase detector is implemented without prior knowledge of the data frequency characteristics. In such situations lock up tends to occur at small integer ratios of the data frequency, such as 4/5 ar 5/7 of the correct data frequency. Jitter accumulation is related to jitter gain, where jitter gain is the difference between the change in phase of the retimed data versus the change in phase of the original data. Ideally jitter gain is one (1). However, if a change in the input phase creates a larger change in the output phase a positive jitter gain results. In transmission and communication systems, where multiple clock extraction and retiming occur, jitter gain can accumulate exponentially from the beginning to the end of the system. Additionally, many traditional phase locked loop systems incorporate second order filters which can cause peaking of the jitter gain.

As is known, as jitter increases, the reliability and/or accurateness of sampling an incoming data signal decreases. Accordingly, other schemes and techniques have been proposed for clock extraction from NRZ data signals transmitted in the gigabit frequency range. Once such device is disclosed in "PHASE LOCKED LOOP OR CLOCK EXTRACTION IN GIGABIT RATE DATA COMMUNICATION LINKS," filed Nov. 18, 1988, and bearing Ser. No. 24,975, owned by the assignee of the present application. It is noted in that application that if a clock signal can be successfully extracted from the incoming data stream, such clock signal can then be used to sample the data stream, providing a regenerated data stream. However, that device was not capable of recovering a clock signal from purely random NRZ data. The clock recovery scheme disclosed in the application required the NRZ data to be grouped into fixed length frames prior to transmission. At the beginning of each frame, a master transition was provided. By locking on the frequency of the master transition signal, a local oscillator could be locked into generating a two gigabit clock signal, appropriate for use in sampling data. In addition, prior to data transmission a training signal was transmitted in order to facilitate locking of the clock signal.

Consequently, a need still exists for a device which can recover a clock signal from a random NRZ data signal which data signal is transmitted in the gigabit frequency range, which can retime data in relation to the recovered clock signal and which does not suffer from the problem of temperature effected, independent circuitry.

SUMMARY OF THE INVENTION

The advantages of the invention, i.e. overcoming jitter accumulation and frequency lock up, are achieved in a method and apparatus for recovering a clock signal from a random NRZ data signal is shown to include a phase detector for detecting the phase difference between the random NRZ data signal and a clock signal and for generating a phase signal representative of the phase difference. The phase signal is a binary signal having first and second logic levels, wherein first logic level is representative of the clock signal having an early phase relationship with the data signal and wherein the second logic level is representative of the clock signal having a late phase relationship with the data signal. Clock recovery also incorporates an integrator for integrating the phase signal over a period of time and for generating an integration signal representative of such integration and an oscillator for generating the clock signal at a clock frequency responsive to both the phase signal and the integration signal. The clock frequency is determined by a centering factor and an offset factor. The centering factor is controlled by the integration signal and the offset factor is controlled by the phase signal. There is also shown a particular phase detector, several integrators and a preferred oscillator for practicing the invention.

BRIEF DESCRIPTION OF THE DRAWINGS

The present invention will be better understood, and its numerous objects and advantages will become apparent by reference to the following detailed description of the invention when taken in conjunction with the following drawings, in which:

FIG. 6 is a schematic diagram of a preferred embodiment of a phase determination component shown in FIG. 5;

FIG. 7 is a schematic diagram showing an integrator in accordance with the present invention;

FIG. 8 is a unity gain amplifier for use in the integrator shown in FIG. 7;

FIG. 9 is a unity gain amplifier for use in the integrator shown in FIG. 9;

DETAILED DESCRIPTION OF THE PREFERRED EMBODIMENT

Figure 1:
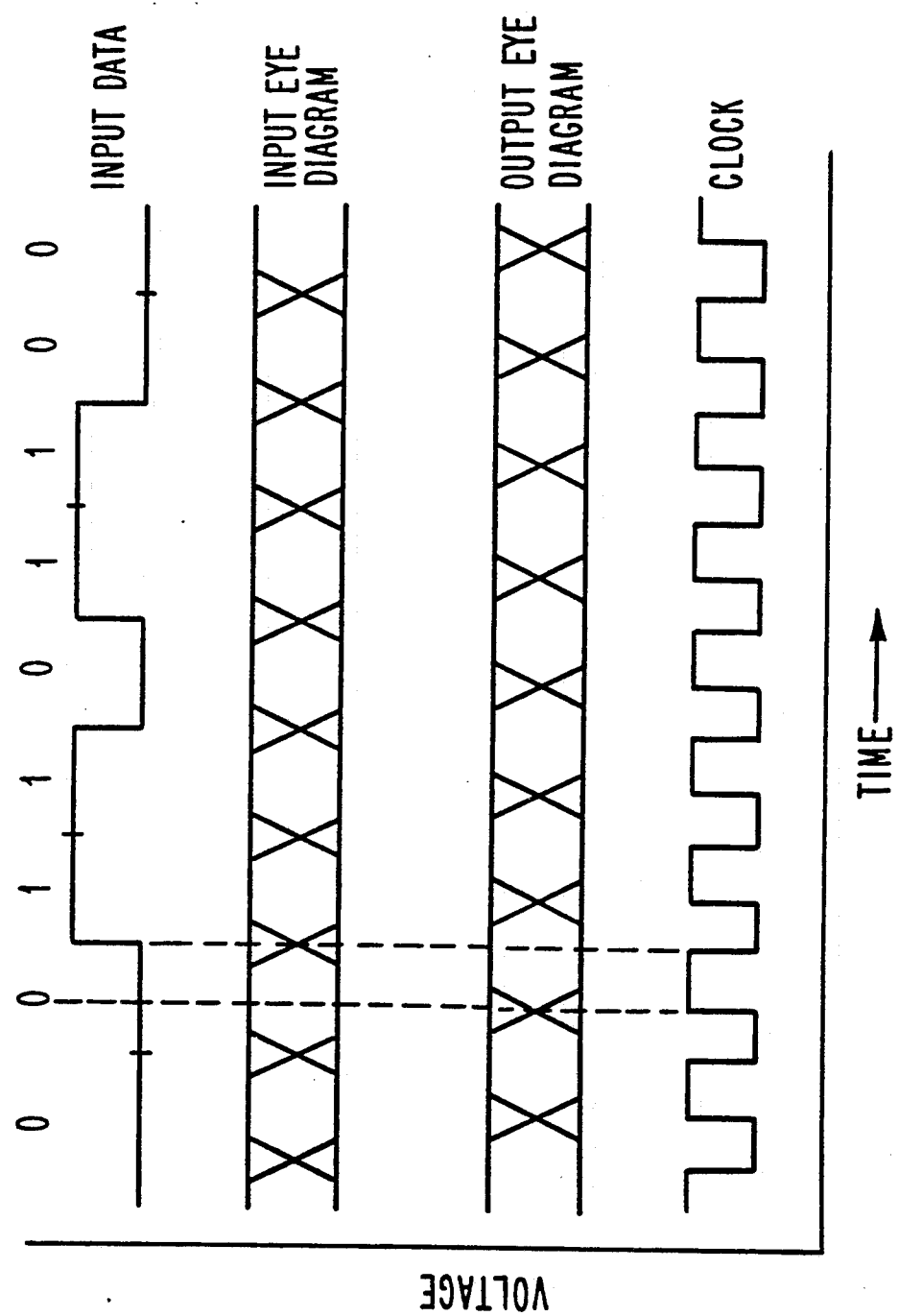
FIG. 1 is a graph of various digital signals including NRZ data signals and a clock signal.
Figure 2:
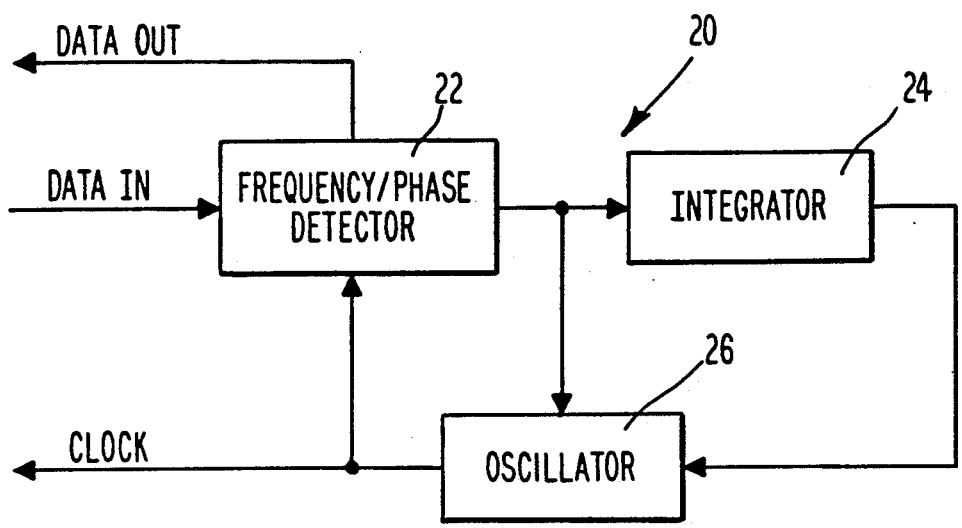
FIG. 2 is a block diagram of an apparatus for recovering a clock signal from a random NRZ data signal in accordance with the present invention.

A new and novel apparatus for recovering a clock signal from a random NRZ data signal is shown in FIG. 2, and generally designated 20. Device 20 is shown to include a frequency/phase detector 22, an integrator 24 and an oscillator 26. Frequency/phase detector 22 compares a random NRZ data signal with a clock signal generated by oscillator 26 to determine the frequency/phase relationship between these signals. Detector 22 generates a phase signal which is representative of the phase difference between the clock signal and the random NRZ data signal which phase signal is binary in nature, i.e. having first and second logic levels. The first logic level of such phase signal is representative of the clock signal being early in phase with the data signal. The second logic level is representative of the clock signal being late in phase in relation to the data signal.

Integrator 24 is connected to receive the phase signal generated by detector 22. Integrator 24 integrates the phase signal over time and generates an integration signal, representative of such integration operation. The integration signal is provided to oscillator 26.

Oscillator 26 is connected to receive both the phase signal and the integration signal. Oscillator 26 generates the clock signal at a clock frequency which is responsive to both the phase signal and the integration signal. The frequency of the clock signal is determined by a centering factor and an offset factor, wherein the centering factor is controlled by the integration signal and the offset factor is controlled by phase signal. As will be described in greater detail hereinafter, the integration signal is utilized to control the time delay of a clock generator circuit, which time delay is directly proportional to the frequency of the clock signal. In other words, the clock signal is centered in relation to the time delay controlled by the integration signal. Also to be described in greater detail herein, is the use of the phase signal to control a further time delay device.

Figure 3:
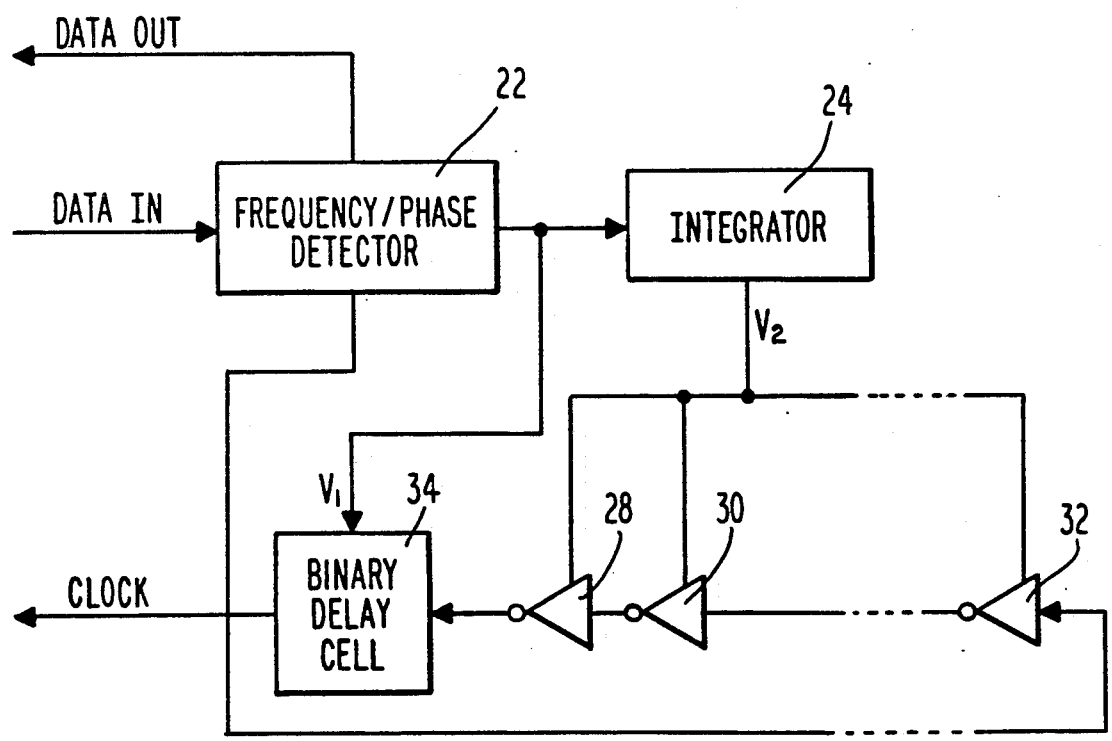
FIG. 3 is an alternative embodiment of the apparatus shown in FIG. 2.

Referring now to FIG. 3, oscillator 26 is shown to include a generator portion, which includes variable delay invertors 28, 30 and 32, and binary delay cell 34 arranged in a loop configuration. The generator portion has a first time delay equal to the sum of the time delays associated with invertors 28, 30 and 32. Delay cell 34 has a second time delay. It will be noted that when connected in the loop shown in FIG. 3, invertors 28, 30 and 32 and delay cell 34 form a so-called ring oscillator. In such an oscillator, the primary limitation is that a net inversion exist in the loop. Consequently, it is within the scope of the present invention for the generator portion to include more than three invertors or an odd number of invertors and some number of non-inverting stages.

The generator portion is shown to consist of an odd number of invertors, each having a time delay of $T_d$. When a rising logic edge propagates around the loop it will, after one round trip, become a falling edge. After two such trips, it will again be a rising edge. Since the time of propagation around the loop is $N \times T_3$, where N represents the number of time delays in the loop, the period of the clock signal is $2N \times T_3$. Consequently, the generator portion oscillates at a frequency of $1/(2N \times T_d)$.

It is possible in such invertors to control the individual time delays with a voltage signal wherein the voltage signal controls bias currents used to modify the delay time of each invertor. Such a ring oscillator is disclosed in U.S. Pat. Application Ser. No. 29,307 entitled "A FULLY INTEGRATED HIGHSPEED VOLTAGE CONTROLLED RING OSCILLATOR" filed June 5, 1987, assigned to the assignee of the present invention and incorporated herein by reference.

The signal generated by the generator portion is termed herein a preliminary clock signal. As shown in FIG. 3, the preliminary clock signal is passed through binary delay cell 34. Binary delay cell 34 provides the preliminary clock signal at an output in relation to the time delay associated with delay cell 34. The time delay associated with delay cell 34 is controlled by the phase signal. The time delay of delay cell 34 alternates between two time periods dependent upon whether the phase signal is representative of an early or late phase relationship. The time delay associated with delay cell 34 is utilized as a offset frequency. As will be described in greater detail hereinafter, the frequency of the clock signal generated by invertors 28, 30 and 32 is varied a small amount Df by delay cell 34 so that the frequency of the clock signal is varied by the offset frequency Df about the center frequency.

In more mathematical terms, if the phase signal is termed $v_1$ and the integration signal is termed $v_2$ oscillator 26 can be said to generate a clock signal at a frequency $f_c$ in accordance the following:

$$f_c = \beta + a v_2 + \begin{cases} +Df \text{ if } v_1 = \text{logic high} \\ -Df \text{ if } v_1 = \text{logic low} \end{cases}$$

Consider now in greater detail detector 22. As indicated previously, the purpose of detector 22 is to compare the phase of the clock signal to the apparent phase of an incoming random NRZ data signal. The "error" signal generated by detector 22 can thereafter be utilized in a phase locked loop type circuit to force the clock signal to match the data signal in both frequency and phase, i.e. clock extraction.

Figure 4:
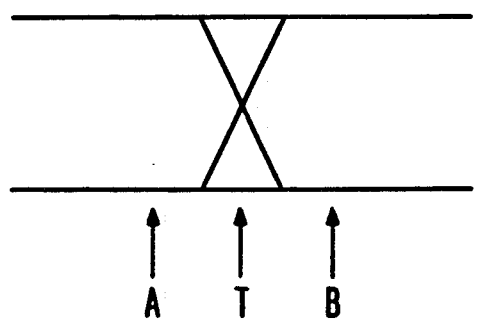
FIG. 4 is a partial depiction of an eye diagram of a random NRZ data signal.
Figure 5:
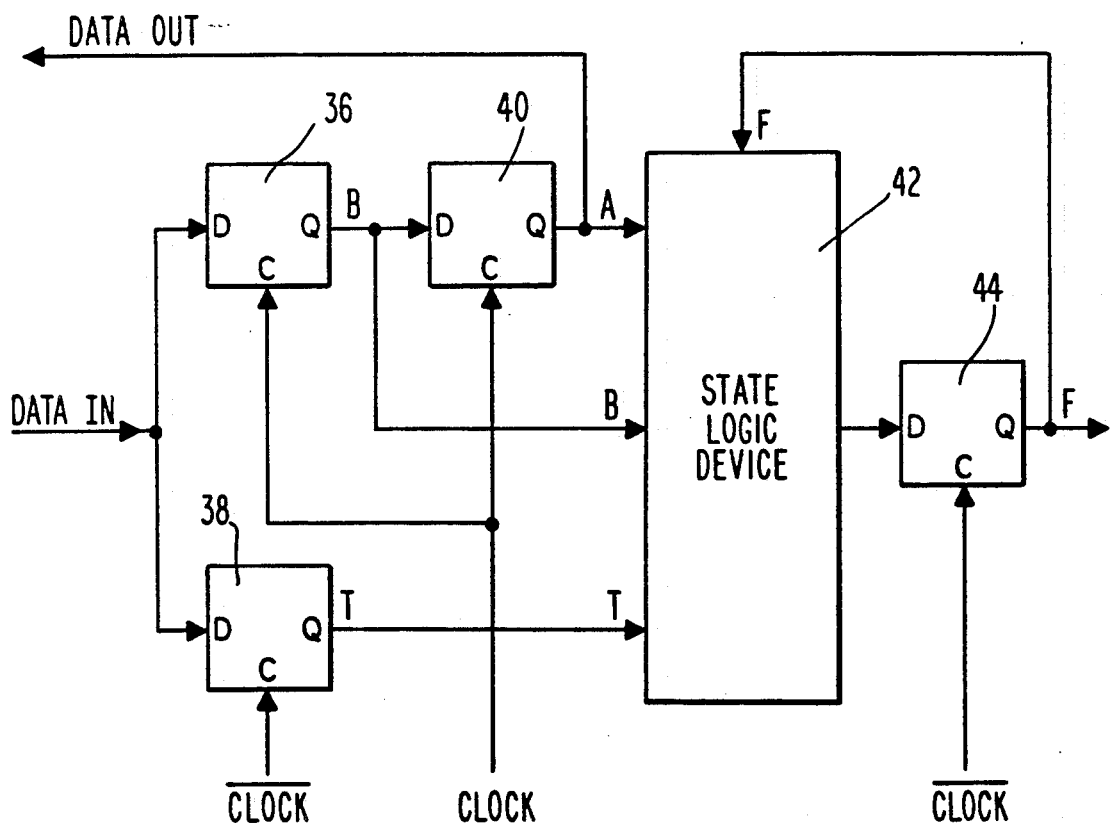
FIG. 5 is a logic diagram of a phase detector in accordance with the present invention.

In order to understand the operation of detector 22, in relation to the circuit diagram shown in FIG. 5, consider first the isolated portion of the data signal shown in FIG. 4. The data signal is sampled to generate a number of consecutive samples, herein designated samples A, T and B. When the frequency and phase of the clock signal is in proper relationship with the data signal, sample A will occur prior to transition, sample T will occur during transition and sample B will occur after transition. If the data signal has had a transition from logic high to logic low or from logic low to logic high the T sample should indicate if the phase of the clock is lagging or leading the input data. Such a relationship was noted and implemented by J.D.H. Alexander, CLOCK RECOVERY FROM RANDOM BINARY SIGNALS, Electronics Letters, Vol. 11, No. 22, Oct. 30, 1975, pp. 541–542. The problem with the implementation of Alexander, is that four sampling conditions could occur where it was not possible to determine whether the clock signal was early or late in the phase with regard to the data signal. Once the clock signal is locked, the detector of Alexander would be suitable for use in the present invention. However, Alexander is prone to false lock up during initial data frequency acquisition.

Detector 22 is able to determine a phase relationship when the phase of the clock signal is either definite or indefinite in relation to the data signal, i.e. data samples. As shown in FIG. 5, the data signal is provided to the input of D flip-flops 36 and 38. Since the Q output of the D flip-flop will follow its input on the detection of a rising edge in the clock signal, the data signal is sampled on both the rising and falling edges of the clock signal. It will be noted that while the clock signal was provided to D flip-flop 36, the complement clock signal is provided to flip-flop 38. Accordingly, the ability of detector 22 to sample incoming data is only limited in frequency by the speed at which flip-flops 36 and 38 can toggle. Additionally flip-flops 36 and 38 are matched, i.e. identical in structure. Consequently, they do not suffer from the problem of temperature effected, independent circuitry as did prior devices. In other words, since flip-flops 36 and 38 are inherently matched no delay exists resulting from circuit or component differences.

The Q output of flip-flop 36 is provided to the D input of D flip-flop 40. The Q output of flip-flop 40 relates to sample A shown in FIG. 4. Similarly, the Q output of flip-flop 36 relates to sample B shown in FIG. 4 while the Q output of flip-flop 38 relates to sample T. Each of the samples A, B and T are provided to state logic device 42. Similar to Alexander, state logic device 42 determines whether the phase of the clock signal is definite or indefinite in relation to the consecutive samples. The difference from Alexander, is that state logic 42 also assigns a definite phase relationship to the clock signal whenever it is determined that the phase is indefinite. To this extent detector 22 also performs frequency detection. The output of state logic device 4 is provided to the D input of D flip-flop 44. The Q output of flip-flop 44 is used as the F input state logic device 42.

Device 42 can be of any digital design so long as the output of device 42 complies with the following truth table:

| A | T | B | F(T+1) | OUTPUT F$_T$ | COMMENTS |
|---|---|---|--------|--------------|----------|
| 0 | 0 | 0 | 0 | 0 | No Edge |

-continued

| A | T | B | F$_{(T+1)}$ | OUTPUT F$_T$ | COMMENTS |
|---|---|---|---|---|---|
| 0 | 0 | 0 | 1 | 1 | Assign last state |
| 0 | 0 | 1 | 0 | 0 | Rising Edge |
| 0 | 0 | 1 | 1 | 0 | Early clock |
| 0 | 1 | 0 | 0 | 1 | Clock Slow |
| 0 | 1 | 0 | 1 | 1 | |
| 0 | 1 | 1 | 0 | 1 | Rising Edge |
| 0 | 1 | 1 | 1 | 1 | Late clock |
| 1 | 0 | 0 | 0 | 1 | Falling edge |
| 1 | 0 | 0 | 1 | 1 | Late clock |
| 1 | 0 | 1 | 0 | 1 | Clock slow |
| 1 | 0 | 1 | 1 | 1 | |
| 1 | 1 | 0 | 0 | 0 | Falling edge |
| 1 | 1 | 0 | 1 | 0 | Early clock |
| 1 | 1 | 1 | 0 | 0 | No edge assign |
| 1 | 1 | 1 | 1 | 1 | last state |

As used herein, the indefinite phase of the clock signal in relation to the data signal is also referred to as the indeterminate or slip state, because it only occurs when the phase makes a transition or slips between 0 and $2\pi$ in either direction. In the device of Alexander, when the clock signal is in the slip state a phase relationship could not be determined, i.e., the phase relationship was indefinite. In the detector of FIG. 5, when a slip state is detected, a phase relationship is assigned to the clock signal. For example, when samples A T B have the values 000 or 111, detector 22 assigns the last determined phase to the clock signal, i.e., the output of flip-flop 44. In other words, when the clock signal is in the so-called slip state, the last phase relationship determined by state logic device 42 will be assigned to the clock signal. As the initial difference in frequency between the clock signal and the data signal are further apart, more phase assignments will occur, tending to produce a frequency compensating signal. To this end, detector 22 acts as a frequency detector for determining the frequency of the clock signal.

Referring now to FIG. 6, the preferred digital design for state logic device 42 is shown. The T and A samples are provided to the inputs of exclusive NOR gate 48. The A and B samples are provided to the inputs of exclusive NOR gate 50. The output of exclusive NOR gate 50 and the F sample are provided to the inputs of NAND gate 52. The output of NAND gate 52 and the output of exclusive NOR gate 48 are provided to the inputs of NAND gate 54. In order to insure proper timing, a delay device 56 is provided between exclusive NOR gate 48 and NAND gate 54. The delay provided by delay device 56 is identical to the delay associated with nand gate 52.

As indicated previously, the output of detector 22 is a binary signal which is applied to both oscillator 26 and integrator 24. Integrator 24 serves to integrate the phase signal over a given time period. In a preferred embodiment of the present invention, an integrator in accordance with the device shown in FIG. 7 is incorporated. In that integrator, the phase signal generated by detector 22 is represented by signal source 56. In that regard, the integrator can be viewed independently as integrating any given voltage signal. The integrator is shown to include a summing device 58 for summing the voltage signal provided by source 56 with a feedback signal and for providing the summed signal through resistor 60 to an output 62. The integrator further includes a charging device, i.e. capacitor 64, for storing the summed signal provided to output 62. The integrator is also shown to include a buffer device 66 connected to the summed device 58 at input 68. Buffer device 66 provides the feedback signal to summing device 58 wherein the feedback signal is representative of the summed signal voltage stored in capacitor 64. In operation, the voltage at capacitor 64 is buffered and summed with the input voltages, which in turn drives resistor 60 further charging capacitor 64. By this scheme, the voltage at capacitor 64 is the integral of the input voltage from source 56.

In the preferred embodiment, buffer device 66 is a unity gain amplifier. It will be noted that the traditional implementation of an integrator is based upon an operational amplifier having capacitor feedback. Such so-called opamp circuits must be internally compensated for stability. By eliminating the need for an operational amplifier in the present integrator, the need for compensation and unexpected oscillations has been eliminated.

In one embodiment of the present invention, the unity gain amplifier includes a transistor connected as an emitter follower, shown in FIG. 8. Transistor 70 has its base connected to output 68, its collector connected to ground and its emitter connected to input 62 and to resistor 72 which in turn is connected to a nominal supply voltage.

As shown in FIG. 9, the unity gain amplifier of the present invention includes a transistor 74 connected in a source follower arrangement. In that arrangement, the base of transistor 74 is connected to output 68, the emitter of transistor 74 is connected to ground and the source of transistor 74 is connected to input 62. The source of FET transistor 74 is also connected to a resistor 76 to which is provided a nominal supply voltage.

Figure 10:
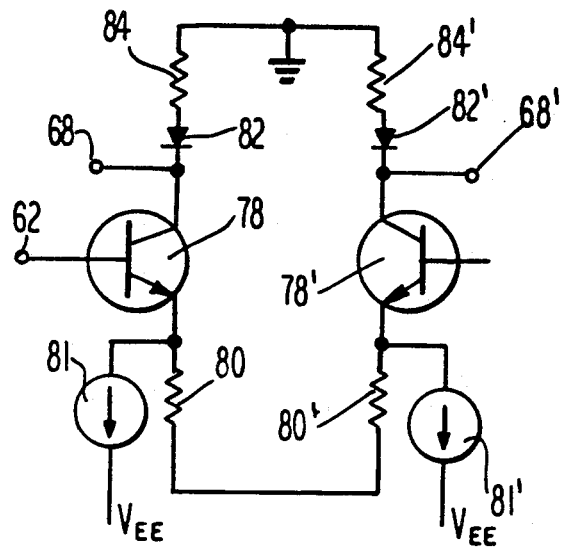
FIG. 10 is a schematic diagram showing a unity gain amplifier for use in the integrator shown in FIG. 7.

In a still further embodiment of the present invention, the unity gain amplifier is an inverting amplifier. As shown in FIG. 10, the inverting amplifier is implemented by connecting the emitters of transistor differential pair 78 and 78' to resistors 80 and 80'. Current sources 81 and 81' are also connected to resistors 80 and 80'. The collector of transistor 78 is connected to input 62. The collector of transistor 78 is further connected in series with diode 82 and resistor 84, which in turn is connected to ground. The values of resistors 80 and 84 are equal. Although an inverting amplifier is being used, those skilled in the art will appreciate that when included an integrated circuit, operations are performed simultaneously on both a given signal and the complement of such given signal. Consequently the complementary output 68' can be utilized.

Figure 11:
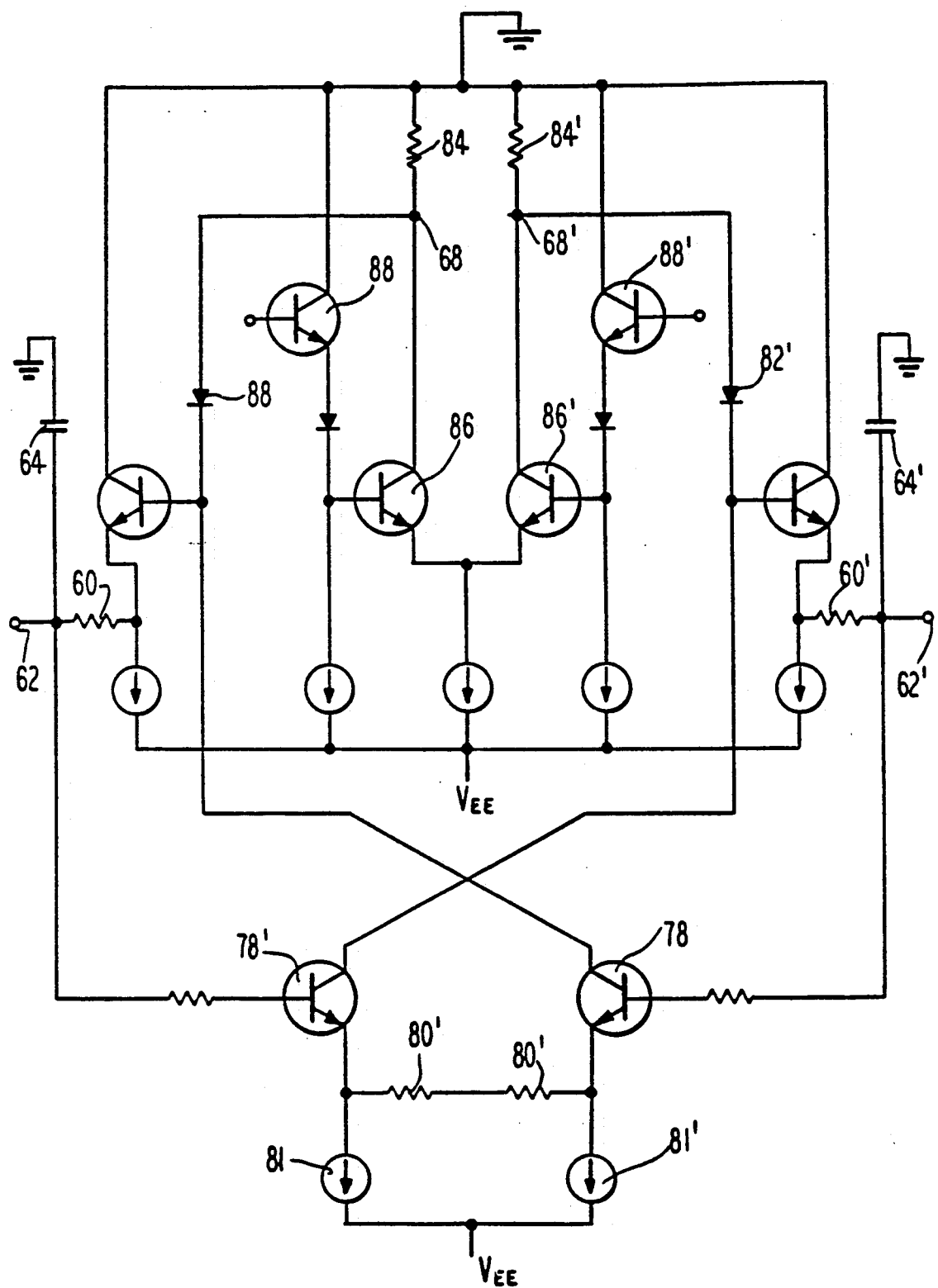
FIG. 11 is a schematic diagram of an integrator in accordance with the present invention.

In an especially preferred embodiment of the present invention, the integrator including the unity gain inverting amplifier of FIG. 10 is implemented in the bipolar arrangement shown in FIG. 11. It will be recognized that the bipolar arrangement of FIG. 11 has two inputs 62 and 62' and two summing points 68 and 68'. Those skilled in the art will appreciate that when included an integrated circuit, such a device acts simultaneously on both a given signal and the complement of such given signal. In other words, if a logic high signal is presented to summing point 68, a logic low signal will be presented to summing point 68'. Transistors 86, 86' 88 and 88' serve the function of the summer 58, shown in FIG. 7.

Figure 12:
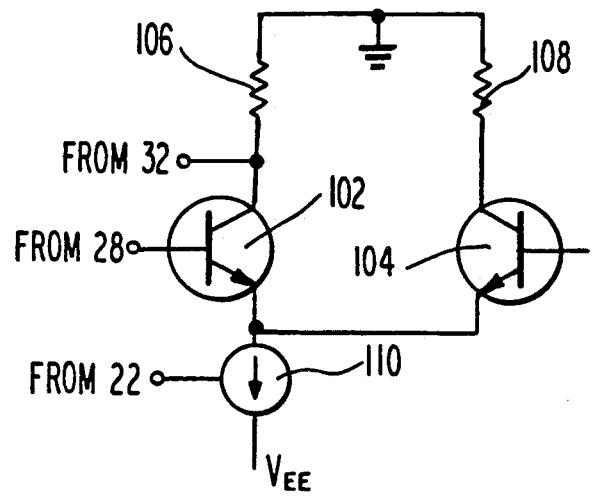
FIG. 12 is a schematic diagram of a delay cell for use in connection with the delay cells shown in FIG. 3.

Referring now to FIG. 12, binary delay cell 34 will be described in greater detail. The delay apparatus for providing a time delay for a given signal in response to a binary signal is generally designated 100. Delay apparatus 10 is shown to include a delay component having an input and output for reproducing at the output the given signal provided to the input within the time delay.

To this end, a differential pair of transistors 102 and 104 are shown having their collectors connected to resistors 106 and 108 respectively, which in turn are connected to ground. Either transistor 102 or 104 will reproduce the signal provided to the base of the transistor at the collector of the transistor within a given time delay. The time delay associated with the delay device is controlled by current source 110. The current source 110 generates a control signal in response to the binary signal from detector 22 so that the time delay of transistors 102 and 104 is of a first time period when the binary signal is a logic high and of a second time period when the binary signal is logic low. This time delay/current relationship is better shown in FIG. 13.

Figure 13:
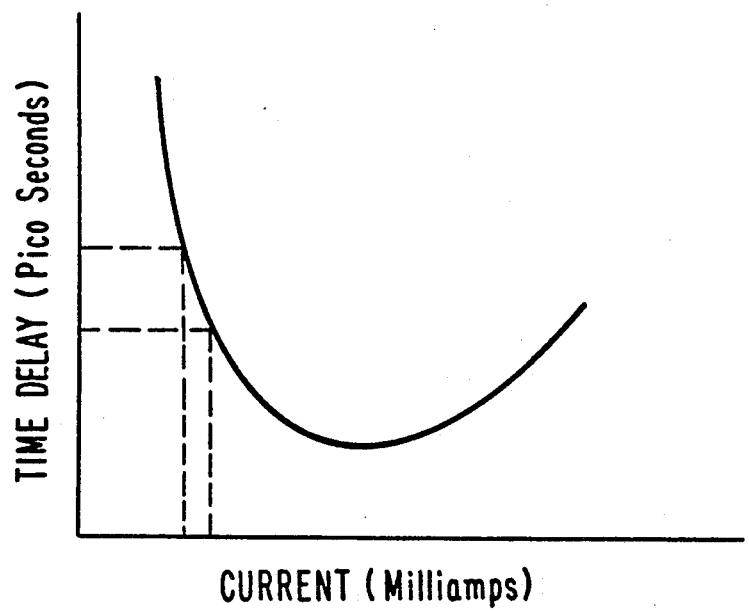
FIG. 13 is a graph of time delay verses current for the delay cells shown in FIG. 12.

As shown in FIG. 13, the time delay of transistor 102 changes in a non-linear fashion as current increases. By choosing a bias current well below that current which corresponds to the minimum delay, it is possible to guarantee that a further decrease in bias current will correspond to an increase in time delay irrespective of process variations and temperature drift. By varying slightly the current output of source 110, the time delay of transistor 102 can be modified in a controlled way.

Direct modulation of the bias current, however, may lead to long settling times, and delay uncertainties due to variations in the digital waveform. The present invention overcomes these difficulties by first converting the input digital signal to a known attenuated digital signal. This attenuated signal is then fed into a voltage to current amplifier, which is the current source of the delay cell. This transconductance amplifier can be designed with low gain, thus further attenuating the original digital signal. The present invention not only provides precise delay modulation, but also, provides extra isolation, which prevents the relatively larger digital glitches of the logic circuitry from feeding through and overshadowing the small modulated current of the delay cell.

Figure 14:
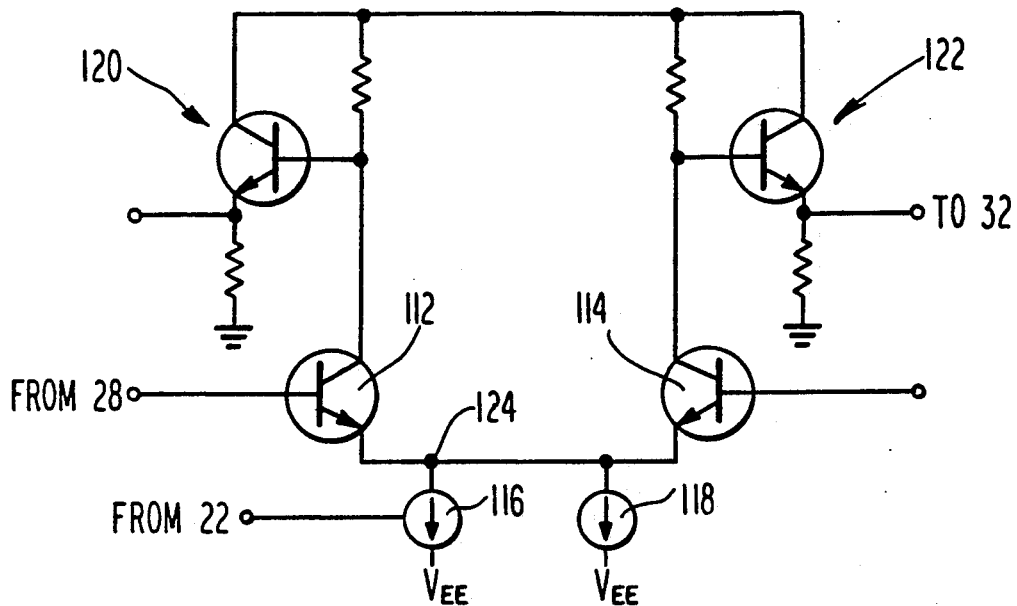
FIG. 14 is a schematic diagram of a delay cell for use in connection with the delay cell shown in connection FIG. 3.

A preferred embodiment of the delay device is shown in FIG. 14. The delay device is shown to include a differential pair of transistors 112 and 114 having their emitters connected to current sources 116 and 118. Current source 116 provides a current output having binary magnitude levels. The level of current output by source 116 is determined by the signal received from detector 22. The collectors of transistors 112 and 114 are connected to level shifts 120 and 122.

Figure 15:
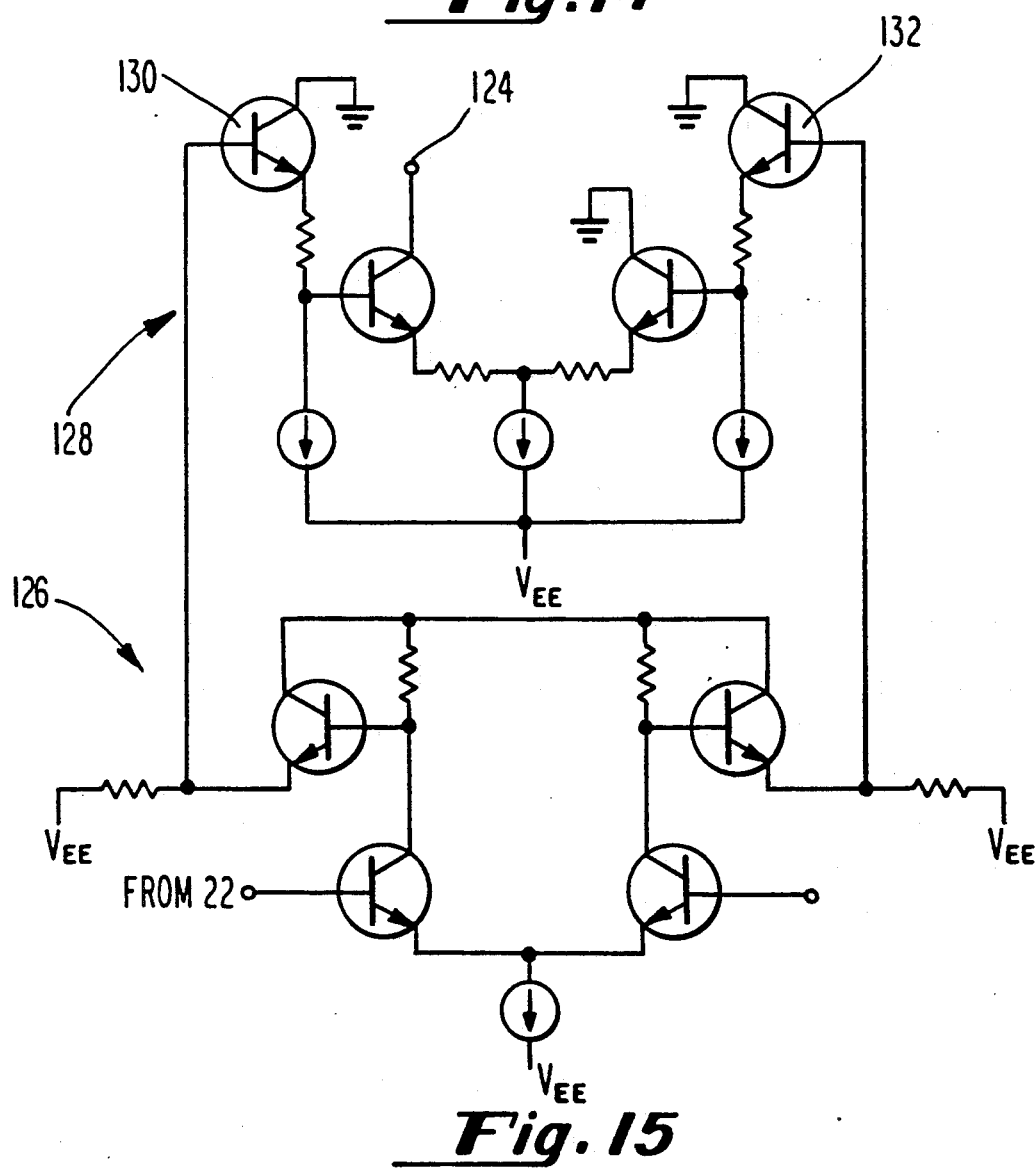
FIG. 15 is a schematic diagram of a current source for use in the circuit shown in FIG. 14.

A preferred embodiment of current source 116 is shown in FIG. 15. The current source is shown to include two stages, a first stage 126 and a second stage 128. The first stage 126 receives the signal from detector 22 and reduces the amplitude of such voltage signal. The reduced amplitude of such voltage signal is provided to the base of transistors 130 and 132, which constitutes the input of second stage 128. Second stage 128 provides a current output at point 124 which has binary magnitude levels. The level of current at output 124 is provided in response to reduced amplitude voltage signal provided to the base of transistors 130 and 132.

In operation, if a logic high signal is output from detector 22, indicating that the clock signal is early in fees, the logic high signal will first be reduced by first stage 126. The reduced amplitude of the logic high signal will be provided to the base of transistor 130 resulting in the high current output being provided to point 124. Conversely, if a logic low voltage signal is provided to the input of first stage 126, a logic low current output will be provided to point 124. In the preferred embodiment, the difference in the binary magnitude levels of the current output at point 124 is approximately 1% of the normal bias current.

While the invention has been described and illustrated with reference to specific embodiments, those skilled in the art will recognize that modification and variations may be made without departing from the principles of the invention as described herein above and set forth in the following claims.

What is claimed is:

1. Apparatus for recovering a clock signal from a random NRZ data signal, comprising:
   a phase detector for detecting the phase difference between said random NRZ data signal and a clock signal and for generating a phase signal representative of said phase difference wherein said phase signal comprises a binary signal having first and second logic levels, said first logic level being representative of said clock signal having an early phase relationship with said data signal and said second logic level being representative of said clock signal having a late phase relationship with said data signal;
   an integrator, connected to receive said phase signal, for integrating said phase signal over a period of time and for generating an integration signal representative of the integration of said phase signal; and
   an oscillator, connected to receive said integration signal and said phase signal, for generating said clock signal at a clock frequency responsive to said phase signal and said integration signal wherein said clock frequency is determined by a centering factor and an offset factor said centering factor being controlled by said integration signal and said offset factor being controlled by said phase signal.

2. The apparatus of claim 1, wherein said oscillator comprises generator means having a first time delay for generating a preliminary clock signal and delay means having a second time delay for receiving said preliminary clock signal and providing said preliminary clock signal at an output in relation to said time delay, wherein said integration signal controls the length of said first time delay, wherein said phase signal controls the length of said second time delay and wherein said generator means and said delay means are arranged in a loop.

3. The apparatus of claim 2, wherein said first generator means comprises a plurality of signal processors connected in series and connected to receive said integration signal, wherein said integration signal controls the time delay of each signal processor.

4. The apparatus of claim 3, wherein each of said signal processors comprises an invertor.

5. The apparatus of claim 1, wherein said phase signal is termed $v_1$, said integration signal is termed $v_2$ and wherein said oscillator generates said clock signal at a frequency ($f_c$) substantially similar with the following:

$$f_c = \beta + \alpha v_2 + \begin{cases} +Df \text{ if } v_1 = \text{logic high} \\ -Df \text{ if } v_1 = \text{logic low} \end{cases}$$

6. The apparatus of claim 2, wherein said second time delay comprises first and second time periods, wherein said second time delay takes the value of said first time period when said phase signal is representative of an early phase relationship and wherein said second time delay takes the value of said second time period when said phase signal is representative of a late phase relationship.

7. A method for recovering a clock signal from a random NRZ data signal, comprising the steps of:
  detecting the phase difference between said random NRZ data signal and a clock signal;
  generating a phase signal representative of said phase difference wherein said phase signal comprises a binary signal having first and second logic levels, said first logic level being representative of said clock signal having an early phase relationship with said data signal and said second logic level being representative of said clock signal having a late phase relationship with said data signal;
  integrating said phase signal over a period of time;
  generating an integration signal representative of the integration of said phase signal; and
  generating said clock signal at a clock frequency responsive to said phase signal and said integration signal wherein said clock frequency is determined by a centering factor and an offset factor said centering factor being controlled by said integration signal and said offset factor being controlled by said phase signal.

8. The method of claim 7, wherein said step of generating said clock signal comprises the steps generating a preliminary clock signal by generator means having a first time delay and delaying said preliminary clock signal in delay means having a second time delay wherein said integration signal controls the length of said first time delay, wherein said phase signal controls the length of said second time delay and wherein the output of said delay means is said clock signal.

9. The method of claim 8, wherein said first generator means comprises a plurality of signal processors connected in series and connected to receive said integration signal, wherein said integration signal controls the time delay of each signal processor.

10. The method of claim 9, wherein each of said signal processors comprises an invertor.

11. The method of claim 7, wherein said phase signal is termed $v_1$, said integration signal is termed $v_2$ and wherein said step of generating said clock signal generates said clock signal at a frequency ($f_c$) substantially similar with the following:

$$f_c = \beta + av_2 + \begin{cases} +Df \text{ if } v_1 = \text{logic high} \\ -Df \text{ if } v_1 = \text{logic low} \end{cases}$$

12. The method of claim 8, wherein said second time delay comprises first and second time periods, wherein said step of delaying said preliminary clock signal comprises the step of utilizing said first time period as said second time delay when said phase signal is representative of an early phase relationship and utilizing said second time period as said second time delay when said phase signal is representative of a late phase relationship.

13. A phase detector for detecting the phase difference between a random NRZ data signal and a clock signal, comprising:
  sampling means, connected to receive said clock signal and said data signal, for sampling said data signal in response to said clock signal and for generating a number of consecutive samples of said data signal; and
  determination means, connected to said sampling means, for determining whether the phase of said clock signal is definite or indefinite in relation to said consecutive samples, for assigning a definite phase relationship whenever said phase is determined to be indefinite, wherein phase assignment is made in response to the frequency relationship between said data signal and said clock signal, and for generating a phase signal representative of the determined phase relationships.

14. The apparatus of claim 13, wherein the definite phase of said clock signal is either the early phase or the late phase and wherein the indefinite phase of said clock signal is the slip state.

15. The apparatus of claim 14, wherein the means for assigning a definite phase relationship to said clock signal comprises skew means for skewing the assignment of a definite phase relationship of said clock signal towards either the early phase or the late phase.

16. The apparatus of claim 15, wherein said skew means assigns the last phase relationship determined by said determination means when it is determined that said clock signal is in the slip state.

17. The apparatus of claim 16, wherein said phase signal comprises a binary signal having first and second logic levels, said first logic level being representative of said clock signal having an early phase relationship and said second logic level being representative of said clock signal having a late phase relationship and wherein said skew means comprises a latch for storing said binary signal.

18. The apparatus of claim 17, wherein said consecutive samples comprises first second and third samples and wherein said means for determining whether said clock is definite or indefinite comprises first and second exclusive OR gates, wherein said first and second samples are provided to the inputs of said first exclusive OR gate and wherein said first and third samples are provided to the inputs of said second exclusive OR gate, wherein the output of said second exclusive OR gate and the output of said latch are provided to the inputs of a first NAND gate, and wherein the output of said first exclusive OR gate and said first NAND gate are provided to the input of a second NAND gate.

19. A method for detecting the phase difference between a random NRZ data signal and a clock signal, comprising the steps of:
  sampling said data signal in response to said clock signal;
  generating a number of consecutive samples of said data signal;
  determining whether the phase of said clock signal is definite or indefinite in relation to said consecutive samples;
  assigning a definite phase relationship whenever said phase is determined to be indefinite, wherein phase assignment is made in response to the frequency relationship between said data signal and said clock signal,; and
  generating a phase signal representative of the determined phase relationships.

20. The method of claim 19, wherein the definite phase of said clock signal is either the early phase or the late phase and wherein the indefinite phase of said clock signal is the slip state.

21. The method of claim 20, wherein the step of assigning a definite phase relationship to said clock signal comprises the step of skewing the assignment of a definite phase relationship of said clock signal towards either the early phase or the late phase.

22. The method of claim 21, wherein the step of assigning a definite phase relationship to said clock signal comprises assigning the last determined phase relationship when it is determined that said clock signal is in the slip state.

23. Apparatus for recovering a clock signal from a random NRZ data signal, comprising:
- a phase detector for detecting the phase difference between said random NRZ data signal and a clock signal and for generating a phase signal representative of said phase difference wherein said phase detector comprises sampling means, connected to receive said clock signal and said data signal, for sampling said data signal in response to said clock signal and for generating a number of consecutive samples of said data signal and determination means, connected to said sampling means, for determining whether the phase of said clock signal is definite or indefinite in relation to said consecutive samples, for assigning a definite phase relationship whenever said phase is determined to be indefinite and for generating a phase signal representative of the determined phase relationships;
- an integrator, connected to receive said phase signal, for integrating said phase signal over a period of time, said integrator comprising summing means for summing said phase signal with a feedback signal and for providing the summed signal to an output, charging means, connected to said output, for storing said summed signal and for providing the summed signal voltage at an output and buffer means, connected to said summing means and said charging means, for providing said feedback signal to said summing means, wherein said feedback signal is representative of said summed signal voltage stored in said charging means wherein said charging means generates an integration signal representative of the signal stored in said charging means; and
- an oscillator, connected to receive said integration signal and said phase signal, for generating said clock signal at a clock frequency responsive to said phase signal and said integration signal, said oscillator comprising generator means having a first time delay for generating a preliminary clock signal and delay means, having an input and an output, for reproducing at said output said preliminary clock signal provided to said input within a second time delay, wherein the length of said second time delay is controlled by a control signal and control means, connected to said delay means, for generating said control signal in response to said phase signal so that said time delay has the value of a first time period when said phase signal is representative of an early phase relationship and so that said time delay has the value of a second time period when said phase signal is representative of a late phase relationship.

24. A method for recovering a clock signal from a random NRZ data signal, comprising the steps of:
- detecting the phase difference between said random NRZ data signal and a clock signal and for generating a phase signal representative of s id phase difference by sampling said data signal in response to said clock signal, generating a number of consecutive samples of said data signal, determining whether the phase of said clock signal is definite or indefinite in relation to said consecutive samples, assigning a definite phase relationship whenever said phase is determined to be indefinite and generating a phase signal representative of the determined phase relationships;
- integrating said phase signal over a period of time, by summing said phase signal with a feedback signal and providing the summed signal to an output, storing said summed signal providing the summed signal voltage at an output and providing said feedback signal to said summing means, wherein said feedback signal is representative of the stored summed signal voltage and generating an integration signal representative of the signal stored in said charging means; and
- generating said clock signal at a clock frequency responsive to said phase signal and said integration signal, by generating a preliminary clock signal, reproducing at an output said preliminary clock signal within a time delay, wherein the length of said time delay is controlled by a control signal and generating said control signal in response to said phase signal so that said time delay has the value of a first time period when said phase signal is representative of an early phase relationship and so that said time delay has the value of a second time period when said phase signal is representative of a late phase relationship.

* * * * *